United States Patent [19]
Hamilton et al.

[11] Patent Number: 5,929,377
[45] Date of Patent: Jul. 27, 1999

[54] APPARATUS FOR PREVENTING LEAKAGE OF ELECTROMAGNETIC RADIATION FROM ELECTRONIC ENCLOSURES

[75] Inventors: Roger Duane Hamilton, Eyota; James Larry Peacock, Rochester; Jerry Richard Rasmussen, Rochester; Charles Clarence Stratton, Rochester, all of Minn.

[73] Assignee: International Business Machines Corporation, Armonk, N.Y.

[21] Appl. No.: 08/950,694

[22] Filed: Oct. 15, 1997

[51] Int. Cl.$^6$ ........................................................ H05K 9/00
[52] U.S. Cl. ........................ 174/35 R; 361/816; 361/753; 361/683
[58] Field of Search ............................ 174/35 GC, 35 R; 361/816, 818, 800, 788, 752, 753, 799, 683, 686, 728, 730, 736; 439/61

[56] References Cited

U.S. PATENT DOCUMENTS

| | | | |
|---|---|---|---|
| 5,023,754 | 6/1991 | Aug et al. ................................. | 361/816 |
| 5,544,008 | 8/1996 | Dimmick et al. ........................ | 361/684 |
| 5,617,296 | 4/1997 | Melville et al. ......................... | 361/736 |

*Primary Examiner*—Kristine Kincaid
*Assistant Examiner*—Hung V Ngo
*Attorney, Agent, or Firm*—Andrew J Dillon; Matthew J. Bussan

[57] ABSTRACT

An apparatus for preventing leakage of electromagnetic radiation from a modular electronic planar substrate surrounded by an enclosure that includes a bottom portion, a top portion, a first side portion having apertures adapted for receiving electronic cables, and a second side portion having electrical connections therein. The apparatus includes a bracket having a first end and a second end, the bracket connected to the first side portion, wherein the bracket includes an interior portion and an outer portion which contiguously form a first bracket wall, a second bracket wall and a third bracket wall, such that the second bracket wall is positioned approximately perpendicular to the first bracket wall and the third bracket wall. A first cover and a second cover each have Z-sectional bends which contact the interior portion of the bracket at the first bracket wall and the third bracket wall to respectively form sealed seams which prevent electromagnetic radiation associated with the electronic planar substrate from leaking beyond the enclosure. In addition, the apparatus includes a first grounding spring and a second grounding spring respectively mounted at the first end and the second end of the bracket to provide a ground path from the enclosure to associated enclosures and assist in preventing the electromagnetic radiation associated with the electronic planar substrate from leaking beyond the enclosure. The interior portion of the bracket wraps about the first side portion and flattens the first cover and the second cover respectively against the first bracket wall and the third bracket wall to provide rigid structural support to the enclosure.

9 Claims, 9 Drawing Sheets

APPARATUS FOR PREVENTING LEAKAGE OF ELECTROMAGNETIC RADIATION FROM ELECTRONIC ENCLOSURES

BACKGROUND OF THE INVENTION

1. Technical Field

The present invention relates generally to electronic devices, and in particular to enclosures for electronic devices. The invention relates particularly to enclosures that consume minimal space and provide structural stability to internal electronic devices. More particularly, the invention relates to enclosures which prevent the leakage of electromagnetic radiation. Still more particularly, the present invention relates to electronic circuit card enclosures and tailstock bracket support structures that promote electromagnetic interference shielding while providing rigid support to electronic circuit cards surrounded by such enclosures.

2. Description of the Related Art

In the electronics and computer industry there exists a continuing need to provide sufficient shielding against electromagnetic radiation leakage. The challenge to designers of electronic and computer devices has been to design enclosures that provide structural integrity to the internal device, such as logic cards, while maintaining the components of the internal device in as compact an arrangement as possible. Logic cards, also referred to as circuit cards, can be described as information-carrying media, common to most computers, for the introduction of data and instructions into the computers either directly or indirectly.

It is critical today to shield electronic equipment such as computer and computer hardware, against electromagnetic interference (EMI) emissions. In the past, computer products contained slower processors. Consequently, the problem of escaping emissions of these types through openings in computer enclosures and logic card enclosures was not significant. But the advent of faster processors and switching circuits has altered this situation. While increased processing speeds have made remarkable improvements in performance and proficiency, EMI containment problems have been exacerbated.

Today, it is not uncommon for computers to employ clock speeds in the range of 50 to 200 MHz or higher. Furthermore, digital circuits operating at these high frequencies may have pulse rise times of a nanosecond or less. These high speeds can cause EMI to be radiated at harmonic frequencies in excess of one GHz. The Federal Communications Commission ("FCC") has established standards that limit the amount of allowable EMI emissions from electronic devices. To meet FCC emissions standards it is necessary to seal around expansion slots holding electronic modules such as logic cards and to seal around slots covered by blanks when these slots are not being used. Such blanks are often referred to in industry as "fillers." In addition, commercial pressure exists to compact the spacing between expansion slots or openings.

To attenuate EMI, electronic modules need to be more properly grounded about their perimeter. Electronic modules are typically packaged next to one another with grounding springs required to be placed between the modules being required. Installing springs on the electronic modules requires special module handling as the delicate springs are easily damaged. A typical electronic module utilized in industry is a logic book, which essentially includes a logic card enclosed within the logic book. Logic books typically plug into a mechanical structure known as a "cage," which maintains one or more logic books in place. Such circuit books generally are utilized in association with computers or computer workstations. Internal components of such computers or computer workstations are susceptible to electromagnetic radiation from logic cards through gaps in the logic book.

Present designs for circuit or logic cards include internal tailstock brackets contacted by "book" or card structure covers, well known in the art of logic card design. The term "tailstock" is traditionally utilized in the art of mechanical engineering to describe a part of a lathe that holds the end of the work not being shaped, allowing it to rotate freely. As applied to the art of logic cards and logic books, the term "tailstock" typically refers to a rear bracket that provides input and output exit ports and EMI shielding to the logic book. Because of the inherent lack of stiffness of existing logic card cover designs, including those which utilize tailstock-type brackets, manufacturing tolerances (i.e., flatness, hole spacing, etc.) and the limitation of fasteners located on the sides of such cards, results in the formation of long gaps between the tailstock bracket and the book covers. Equivalent attenuation of electromagnetic radiation requires shorter slots or gaps with newer cards because such newer cards utilize higher frequency and faster clock speeds. Previous designs also have been designed and constructed with less conductive material which reduces conductivity across joints to a point which, while acceptable to these older designs in association with other contact devices, have an impaired electromagnetic radiation performance when utilized in association with higher frequency cards.

To prevent problems associated with typical logic cards, such as electromagnetic radiation, some sort of card enclosure must be provided. Such an enclosure should be conductive in order to create a Faraday cage, and should not have large openings or slots which may provide entry or exit points for electromagnetic radiation. A Faraday cage, also known as a Faraday shield, is an electrostatic shield, shaped like an enclosed metal box. The Faraday cage or shield can be composed of wire mesh. Typically, a Faraday cage is an enclosed metal box. The higher the speed or frequency of particular logic cards, the smaller any openings, gaps, or slots must be within the logic book in order to provide the same amount of radiation attenuation. Present logic books are designed as Faraday cages and are adequate for the relatively slower clock speeds and frequencies associated with cards presently utilized in industry, but are not adequate for the newer faster frequencies and clock speeds inherent with more advanced logic cards.

From the foregoing it can be seen that a need exists for a logic book enclosure that prevents electromagnetic radiation leakage, while providing rigid structural support to logic cards enclosed within the logic book. From the foregoing it can also be seen that a need exists for logic book enclosures that provide improved grounding. This can be achieved by providing a logic book configuration that maintains intimate contact between the logic card and all grounding and shielding hardware, while also providing shorter gap lengths and positive ground contacts. Present devices do not achieve these goals. A need thus exists for a device which would achieve these goals.

SUMMARY OF THE INVENTION

It is therefore an object of the present invention to provide an improved enclosure apparatus.

It is another object of the present invention to provide enclosures that consume minimal space and provide structural stability to internal electronic devices.

It is yet another object of the present invention to provide improved enclosures for preventing leakage of electromagnetic radiation.

It is still another object of the present invention to provide an improved electronic logic card enclosure.

It is a further object of the present invention to provide improved tailstock bracket structures for logic books.

The above and other objects are achieved as is now described. An apparatus for preventing leakage of electromagnetic radiation from a modular electronic planar substrate surrounded by an enclosure that includes a bottom portion, a top portion, a first side portion having apertures adapted for receiving electronic cables, and a second side portion having electrical connections therein. The apparatus includes a bracket having a first end and a second end, the bracket connected to the first side portion, wherein the bracket includes an interior portion and an outer portion which contiguously form a first bracket wall, a second bracket wall and a third bracket wall, such that the second bracket wall is positioned approximately perpendicular to the first bracket wall and the third bracket wall. A first cover and a second cover each have Z-sectional bends which contact the interior portion of the bracket at the first bracket wall and the third bracket wall to respectively form sealed seams which prevent electromagnetic radiation associated with the electronic planar substrate from leaking beyond the enclosure. In addition, the apparatus includes a first grounding spring and a second grounding spring respectively mounted at the first end and the second end of the bracket to provide a ground path from the enclosure to associated enclosures and assist in preventing the electromagnetic radiation associated with the electronic planar substrate from leaking beyond the enclosure. The interior portion of the bracket wraps about the first side portion and flattens the first cover and the second cover respectively against the first bracket wall and the third bracket wall to provide rigid structural support to the enclosure.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
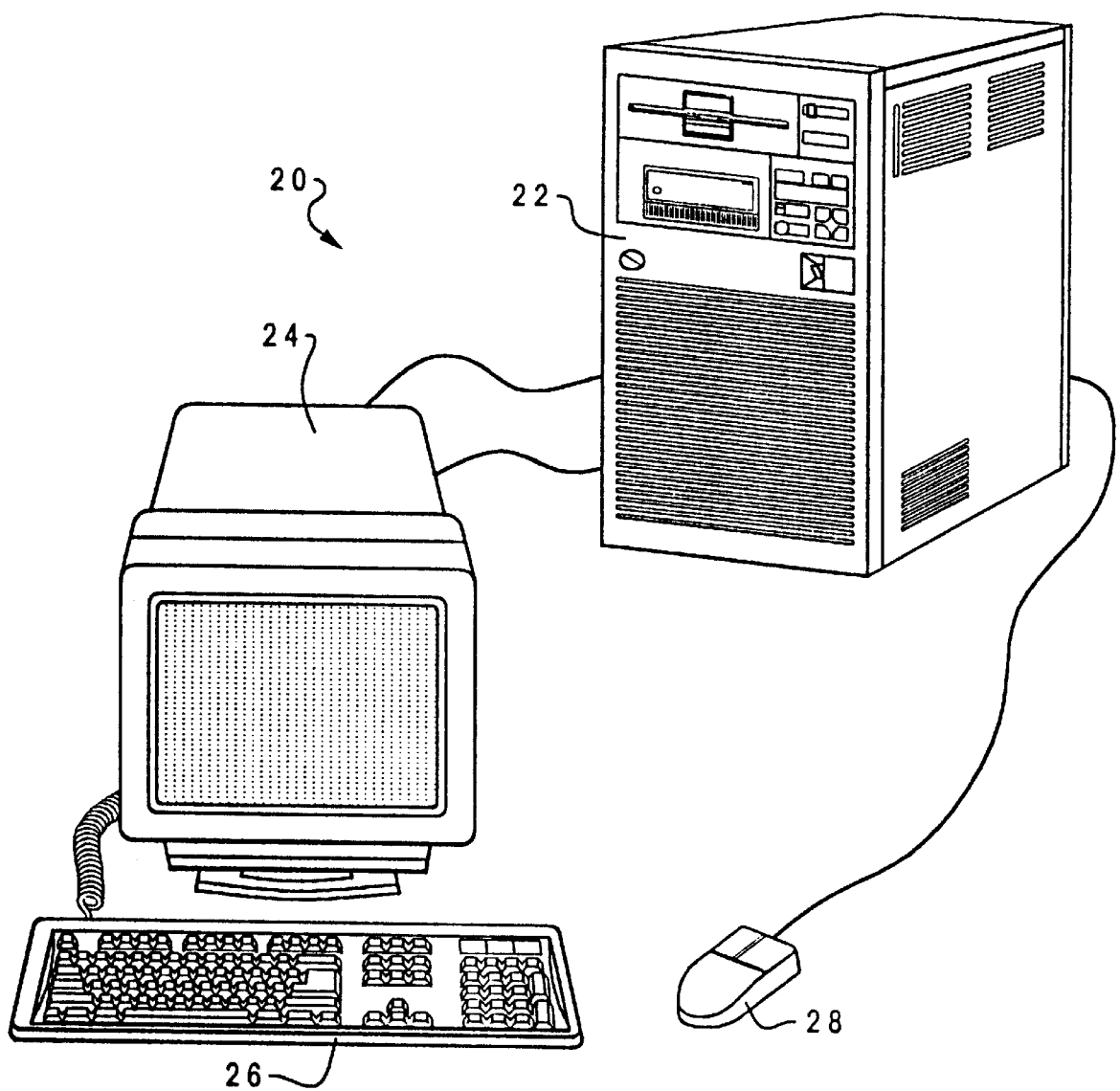
FIG. 1 depicts a pictorial representation of a data-processing system which may be implemented in accordance with a preferred embodiment of the present invention.

With reference now to the figures and in particular with reference to FIG. 1, there is depicted a pictorial representation of a data-processing system which may be implemented in accordance with a preferred embodiment of the present invention. A computer 20 is depicted which includes a system unit 22, a video display terminal 24, a keyboard 26, and a mouse 28. Computer 20 depicted in FIG. 1 may be implemented utilizing a computer such as the IBM AS/400 series, a product of International Business Machines Corporation, located in Armonk, N.Y. "AS/400" is a trademark of International Business Machines Corporation. Computer 20 is but one example of an electronics device or system in which a preferred embodiment of the present invention may be implemented. It can be appreciated by those skilled in the art that completely different electronic devices can be implemented in accordance with a preferred embodiment of the present invention. For example, electronic devices ranging from oscilloscopes to receivers can also be utilized in accordance with a preferred embodiment of the present invention.

Figure 2:
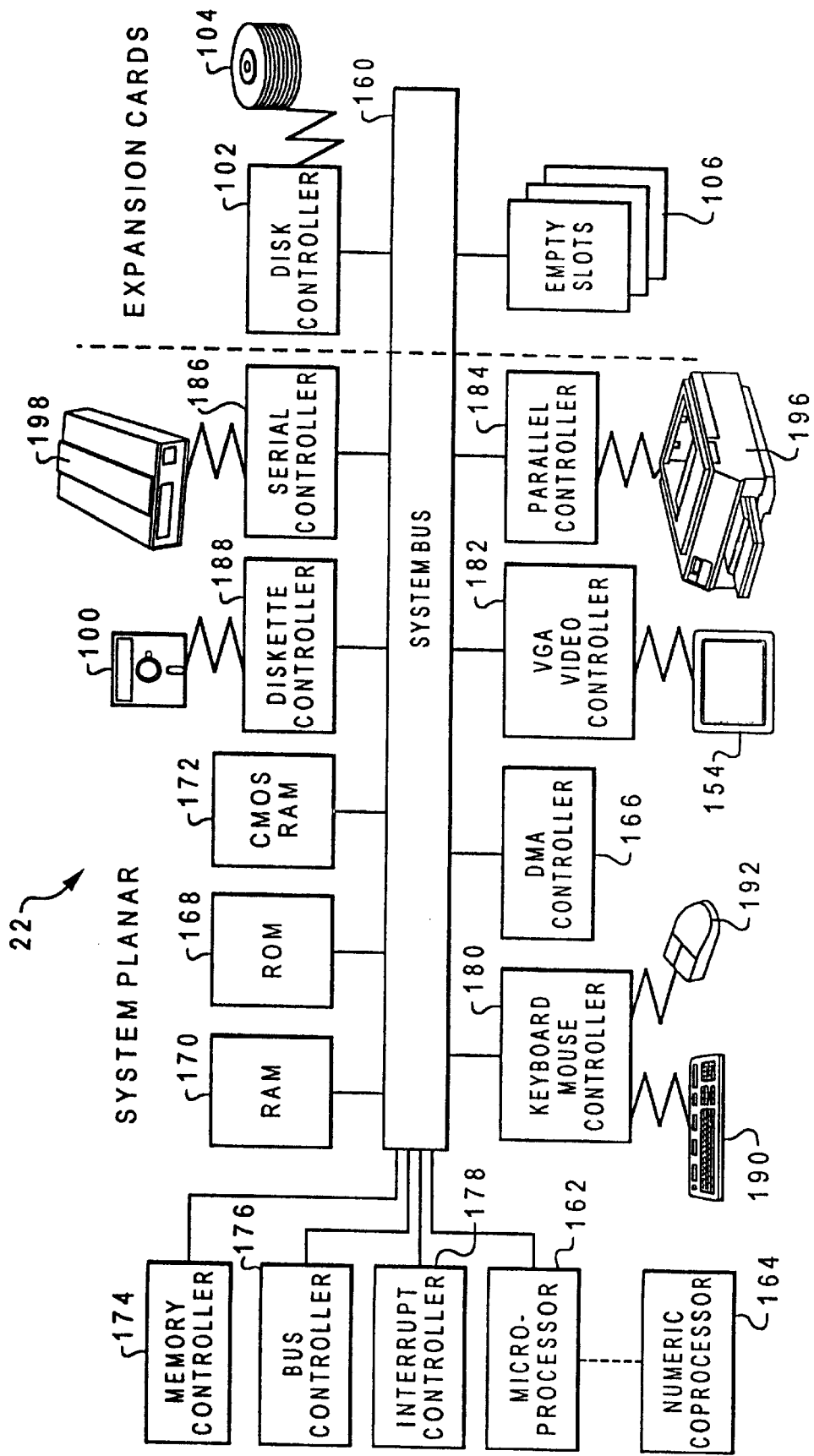
FIG. 2 illustrates a block diagram of selected components in a personal computer in which a preferred embodiment of the present invention may be implemented.

Referring now to FIG. 2, there is depicted a block diagram of selected components in computer 20 in which a preferred embodiment of the present invention may be implemented. System unit 22 preferably includes a system bus 160 for interconnecting and establishing communication between various components in system unit 22. Microprocessor 162 is connected to system bus 160 and also may have numeric coprocessor 164 connected to it. Direct memory access (DMA) controller 166 is also connected to system bus 160 and allows various devices to appropriate cycles from microprocessor 162 during large I/O transfers.

Read Only Memory (ROM) 168 and Random Access Memory (RAM) 170 are also connected to system bus 160. ROM 168 contains the power-on self test (POST) and the Basic Input/Output System (BIOS) which control hardware operations, such as those involving disk drives and the keyboard. Read only memory (ROM) 168 is mapped into the microprocessor 162 address space in the range from 640K to 1 megabyte. CMOS RAM 172 is attached to system bus 160 and contains system configuration information. Also connected to system bus 160 are memory controller 174, bus controller 176, and interrupt controller 178 which serve to aid in the control of data flow through system bus 160 between various peripherals, adapters, and devices.

System unit 22 also contains various input/output (I/O) controllers such as: keyboard and mouse controller 180, video controller 182, parallel controller 184, serial controller 186, and diskette controller 188. Keyboard and mouse controller 180 provide a hardware interface for keyboard 190 and mouse 192. Video controller 182 provides a hardware interface for video display terminal 154. Parallel controller 184 provides a hardware interface for devices such as printer 196. Serial controller 186 provides a hardware interface for devices such as modem 198. Diskette controller 188 provides a hardware interface for floppy disk unit 100. Video display terminal 154 is analogous to video display terminal 24 of FIG. 1. Keyboard 190 and mouse 192 are analogous respectively to keyboard 26 and mouse 28 of FIG. 1.

Expansion cards also may be added to system bus 160, such as disk controller 102, which provides a hardware interface for hard disk unit 104. Empty slots 106 are provided so that other peripherals, adapters, and devices may be added to system unit 22. For example, logic books may plug into empty slots 106. Those skilled in the art can appreciate that the hardware depicted in FIG. 2 may vary for specific applications. For example, other peripheral devices such as: optical disk media, audio adapters, or chip programming devices such as a PAL or EPROM programming device, and the like also may be utilized in addition to or in place of the hardware already depicted.

Figure 3:
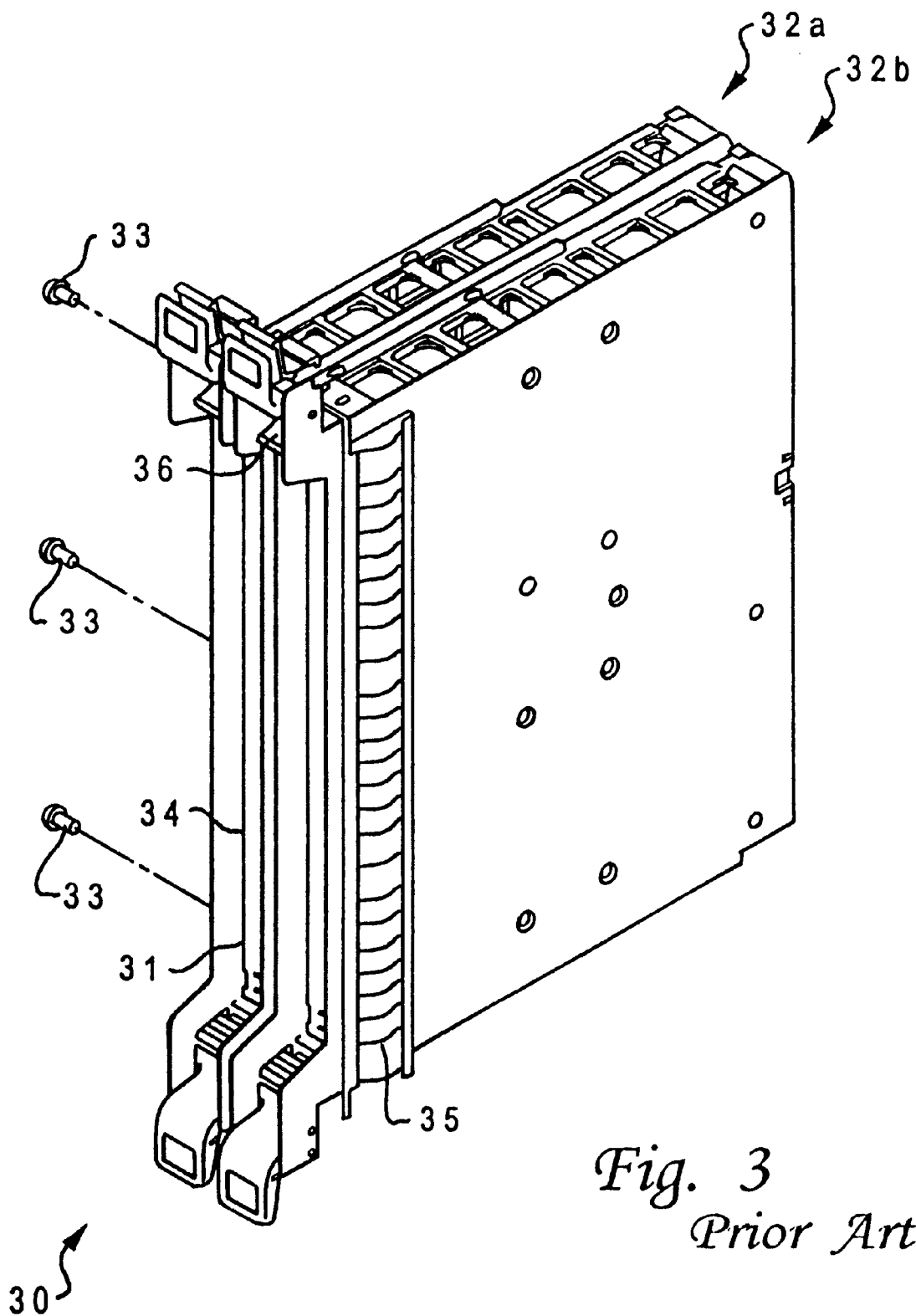
FIG. 3 depicts an angular cross-sectional view of a portion of a prior art logic book.

FIG. 3 depicts an angular cross-sectional view of a portion of a prior art logic book 30. Logic book 30 includes an internal tailstock bracket 31 which is contacted by book covers 32a and 32b. Because of an inherent lack of stiffness of the existing cover design, manufacturing tolerances such as flatness and hole-spacing, and the limitation of three fasteners 33 per side, long gaps 34 occur between tailstock bracket 31 and covers 32a and 32b. Equivalent attenuation of electromagnetic energy requires shorter gaps or slots with new cards that utilize reduced conductivity and faster clock speeds. Designs such as that of logic book 30 have typically been constructed with less conductive material which results in reduced conductivity across joints such as book springs 35 and between books 32a and 32b. Reduced conductivity is acceptable in designs such as logic book 30 which utilize contact devices such as contact device 36. However, in electromagnetic radiation shielding performance is impaired with newer contact devices utilized in association with higher frequency cards. Springs 36 provide an ESD discharge path to other conductive members in which the logic book 30 is installed. Logic book 30 can be utilized in association with the computer system depicted in FIG. 1 and FIG. 2.

Figure 4:
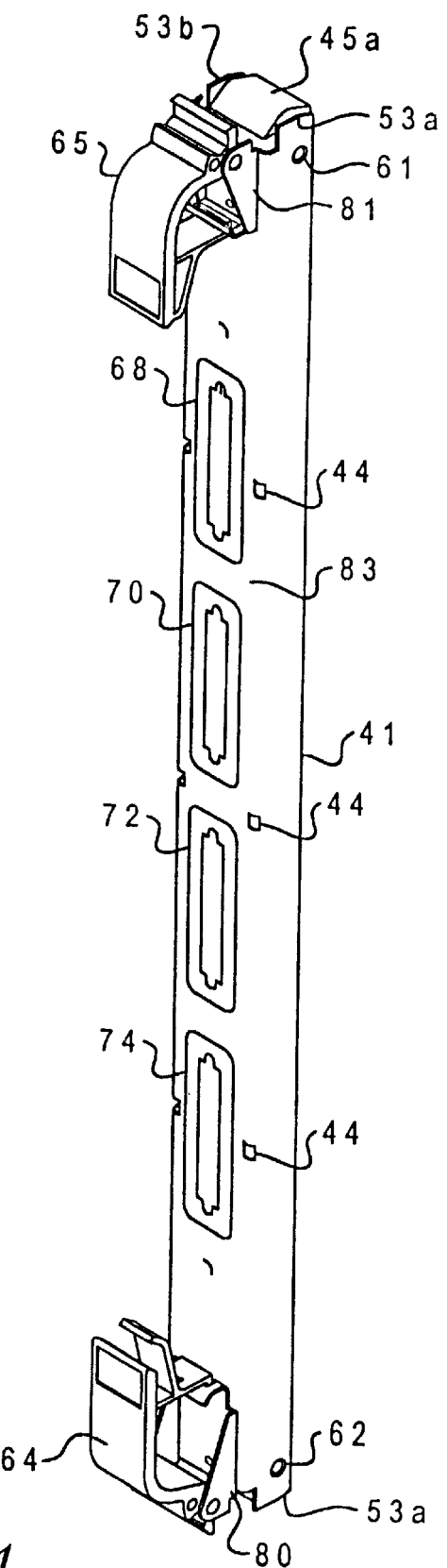
FIG. 4 illustrates an angular view of a tailstock bracket in accordance with a preferred embodiment of the present invention.

In FIG. 4 to FIG. 8 described herein, identical parts are indicated by identical reference numerals. FIG. 4 illustrates an angular view of a wrap-around tailstock bracket 41 in accordance with a preferred embodiment of the present invention. Wrap-around tailstock bracket 41 includes apertures 68, 70, 72 and 74 which are adapted for receiving electronic cables. Holes 61 and 62 are positioned to receive screws and holes 44 are positioned to receive tabs. In addition, wrap-around tailstock bracket 41 includes release mechanisms 65 and 64, which when activated, force wrap-around tailstock bracket 41 away from any structure to which it is connected. Release mechanisms 65 and 64 are respectively attached to braces 81 and 80. Each brace 81 and 80 is connected to an outer portion 83 of wrap-around tailstock bracket 41. Wrap-around tailstock bracket 41 also includes an inner portion (not shown). Wrap-around tailstock bracket 41 is shaped as a trough structure that includes bracket walls contiguous with one another at right angles. A spring 45a is positioned between flanges 53a and 53b. Spring 45a is positioned flush against flanges 53a and 53b. A similar spring is positioned opposite spring 45a at the opposite end of wrap-around tailstock bracket 41. Although this spring is not depicted in FIG. 4, because it is hidden from view, this spring is identified as spring 45b in FIG. 5. Those skilled in the art will appreciate that FIG. 4 to FIG. 8 serve to depict different views of the same configuration and same components. Thus, certain components are hidden from view in certain figures.

Figure 5:
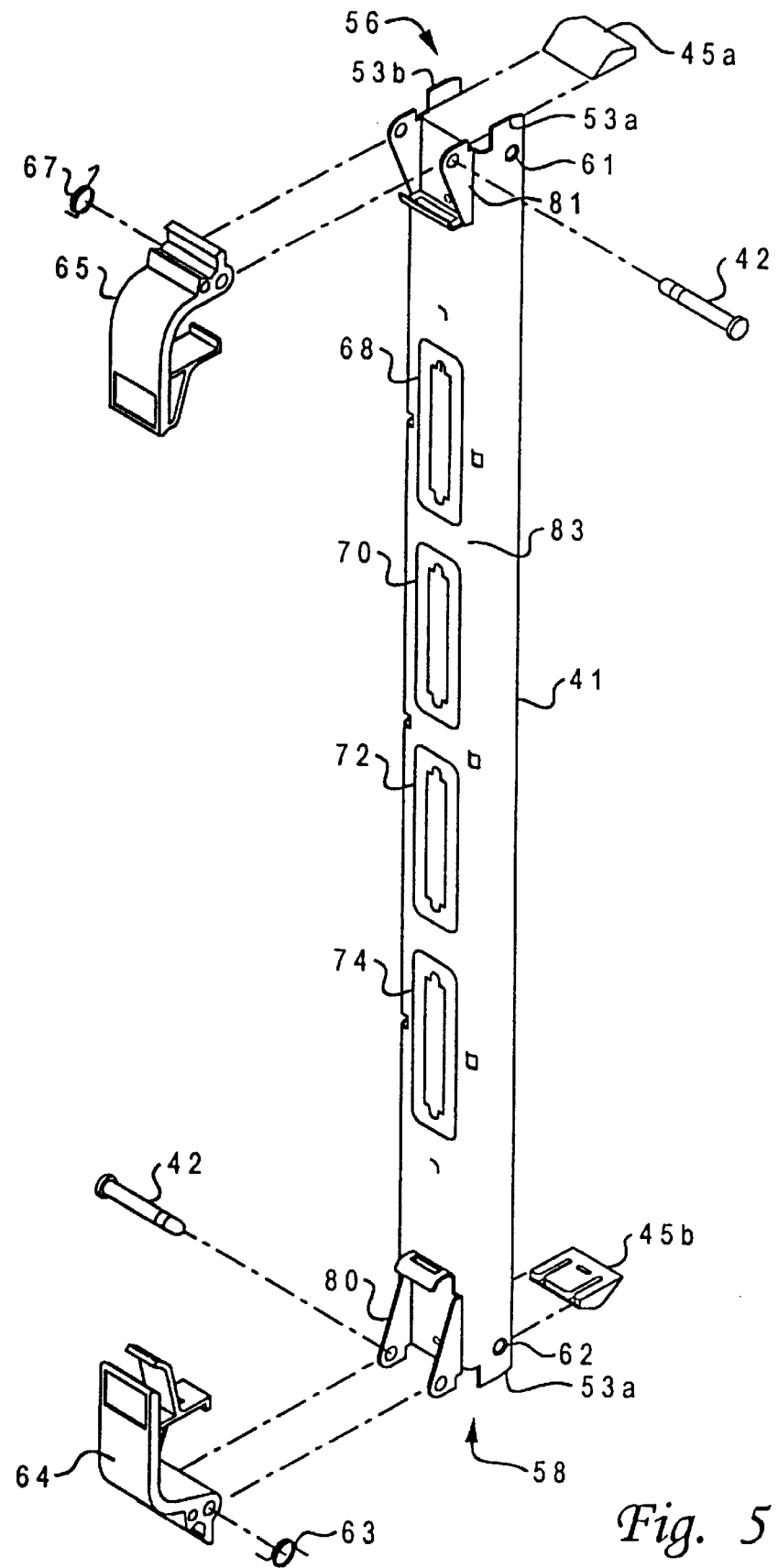
FIG. 5 depicts an angular exploded view of the tailstock bracket illustrated in FIG. 4, in accordance with a preferred embodiment of the present invention.

FIG. 5 depicts an angular exploded view of wrap-around tailstock bracket 41 illustrated in FIG. 4, in accordance with a preferred embodiment of the present invention. FIG. 5 presents a more detailed view of wrap-around tailstock bracket 41 than the view depicted in FIG. 4. FIG. 5 depicts how the various pieces of wrap-around tailstock bracket 41 fit together. Wrap-around tailstock bracket 41 includes a spring 67 which is connected to release mechanism 65. Spring 67 provides support to release mechanism 65 when release mechanism 65 is attached to brace 81. Wrap-around tailstock bracket 41 also includes a spring 63 which is connected to release mechanism 64. Spring 63 provides support to release mechanism 64 when release mechanism 64 is attached to brace 80. A screw 42 fits within hole 61 to connect wrap-around tailstock bracket 41 to the walls of a card enclosure. Similarly, another screw 42 can fit in hole 62. Although not depicted in FIG. 5, those skilled in the art will appreciate that holes sit on the other side of wrap-around tailstock bracket 41 opposite holes 61 and 62. Spring 45a fits within the walls of flanges 53a and 53b at the top 56 of wrap-around tailstock bracket 41. Similarly, spring 45b fits within the walls of flanges 53a and 53b at the bottom 58 of wrap-around tailstock bracket 41.

Figure 6:
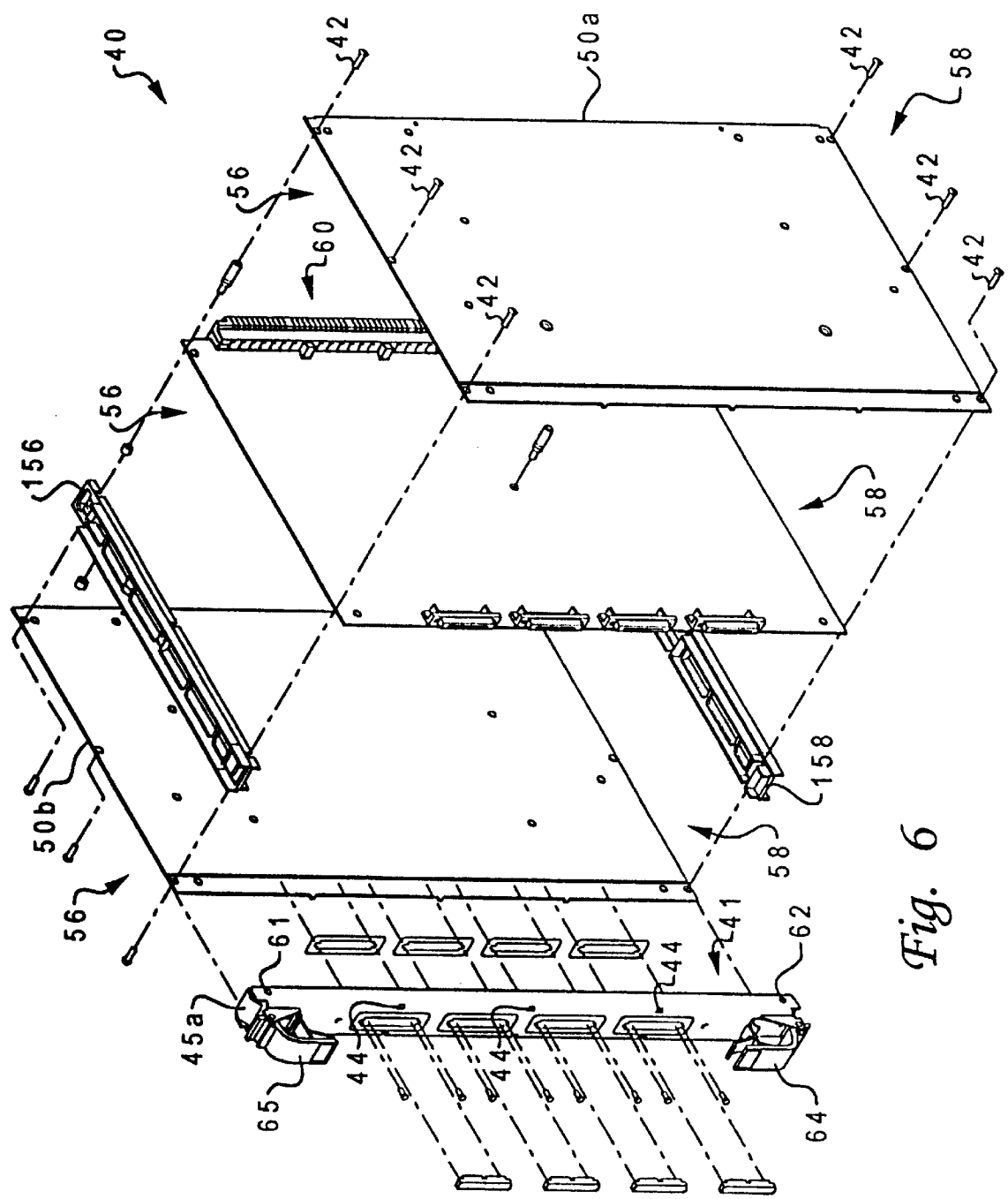
FIG. 6 illustrates an exploded view of a logic book, in accordance with a preferred embodiment of the present invention.

FIG. 6 illustrates an exploded view of logic book 40, in accordance with a preferred embodiment of the present invention. Logic book 40 includes two covers 50a and 50b and a top rail 156 and a bottom rail 158. Logic book 40 also includes an outside mounted, wrap-around tailstock bracket 41 that can be held in place with screws. The logic card, together with covers 50a and 50b, compose a logic book. Tabs (not shown) positioned on covers 50a and 50b provide a tight sliding fit with holes 44 on wrap-around tailstock bracket 41 when all of the pieces depicted in FIG. 6 are appropriately combined. Springs 45a and 45b are attached directly to wrap-around tailstock bracket 41. Covers 50a and 50b each have a Z-section bend that allow flanges 53a and 53b of wrap-around tailstock bracket 41 to respectively fit flush against the surfaces of covers 50a and 50b, which increases cover rigidity and thus, the flatness of logic book 40, which in turn makes it easier to create joints between covers 50a and 50b and wrap-around tailstock bracket 41 that are tight and have a minimum gap length, while permitting the reduction in the number of fasteners from the prior art configuration depicted in FIG. 3.

Logic book 40 is grounded/sealed to adjacent books with conductive flexible springs. These conductive flexible springs are depicted in FIG. 3, and are part of the cage assembly depicted in FIG. 9 (i.e., conductive flexible springs 35). These springs contact flanges 53a and 53b of wrap-around tailstock bracket 41 to provide book-to-book grounding. Because contact points for these springs are placed in front of any gap created in wrap-around tailstock bracket 41 to cover joints, entry and exit points for potential electromagnetic radiation are further reduced, as opposed to the entry and exit points that exist in the examples depicted in FIG. 3 and FIG. 10 herein. All of the components critical to EMI shielding depicted in FIG. 4 to FIG. 8 are derived from metal and are thus more conductive than the design illustrated in FIG. 3 and FIG. 10, thus providing overall better grounding. Although release mechanisms 65 and 64 are composed of plastic, release mechanisms 65 and 64 are utilized for latching purposes only, and thus are not components critical to EMI shielding.

Figure 7:
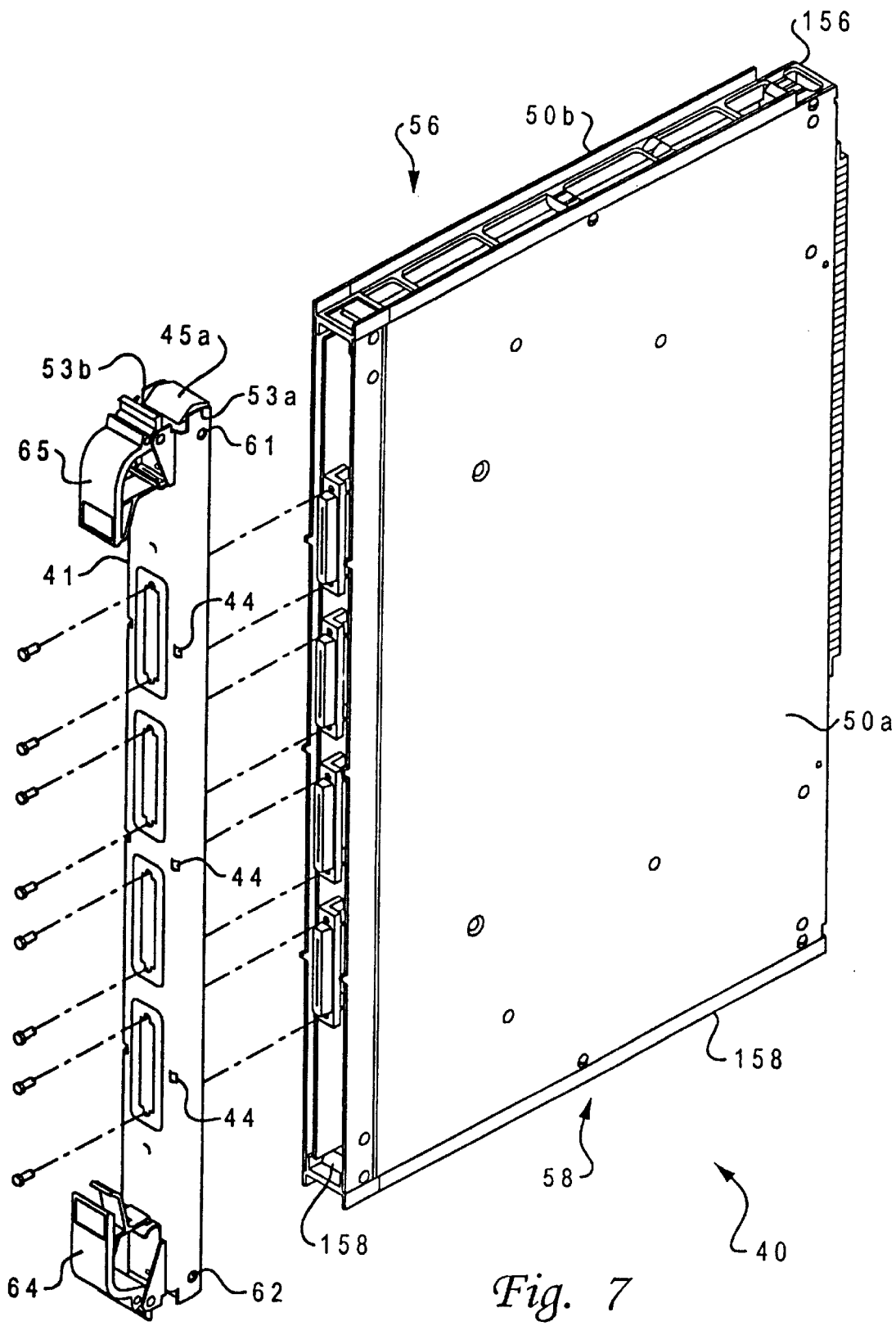
FIG. 7 depicts an angular cross-sectional exploded view of a logic book, in accordance with a preferred embodiment of the present invention.

FIG. 7 depicts an angular cross-sectional exploded view of a logic book 40 in accordance with a preferred embodiment of the present invention. Wrap-around tailstock bracket 41 includes holes 61 and 62 through which screws may be connected in order to assist in attaching wrap-around tailstock bracket 41 to logic book 40. Logic book 40 includes two covers 50a and 50b and a top rail 156 and a bottom rail 158. Top rail 156 is located at the top 56 of logic book 40. Bottom rail 158 is located at the bottom 58 of logic book 40. Holes 44 are included with wrap-around tailstock bracket 41 for receiving tabs (not shown) that assist in connecting wrap-around tailstock bracket 41 to logic book 40.

Figure 8:
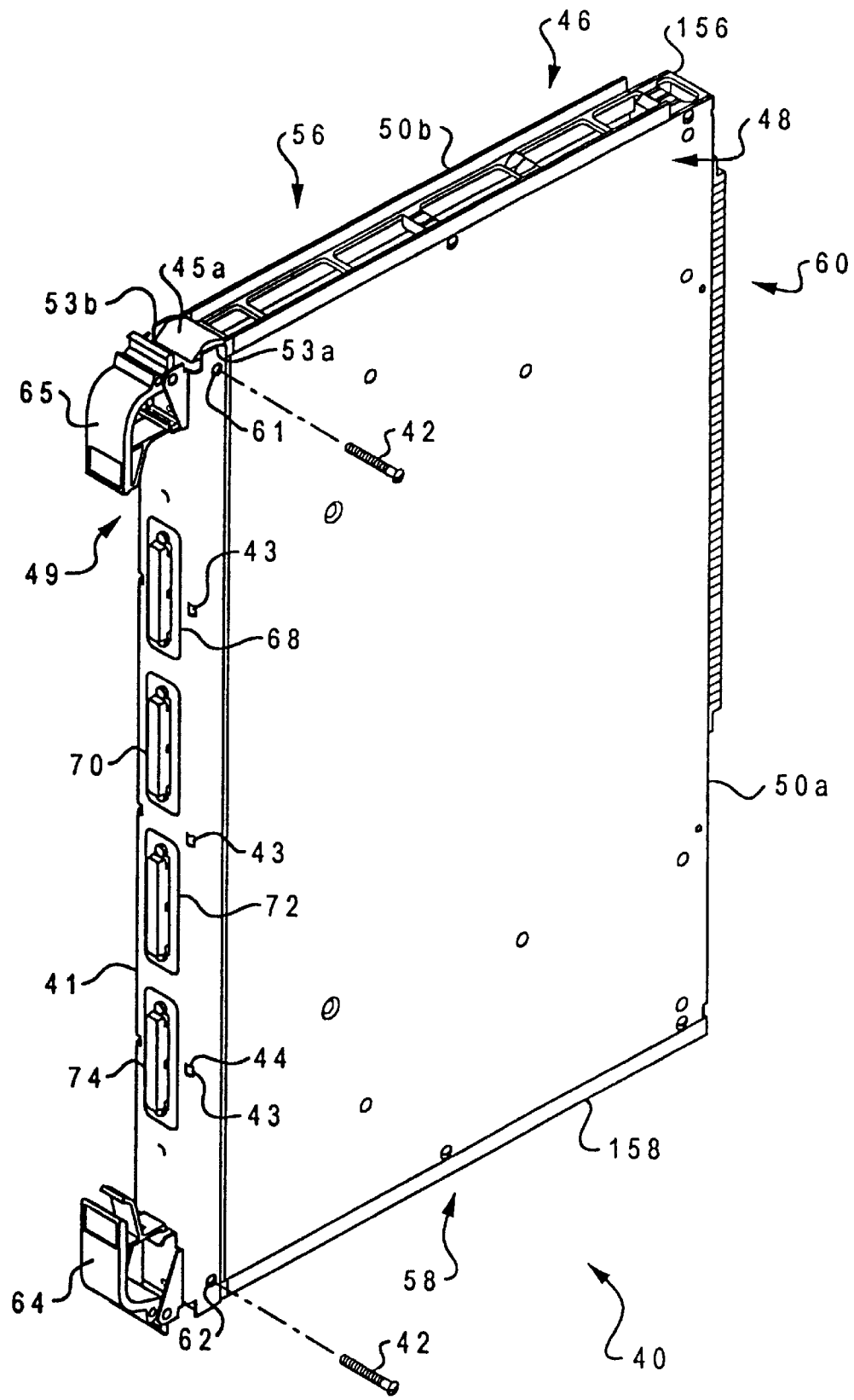
FIG. 8 illustrates an angular cross-sectional view of a portion of a logic book, in accordance with a preferred embodiment of the present invention.

FIG. 8 depicts an angular cross-sectional view of a portion of logic book 40 in accordance with a preferred embodiment of the present invention. Logic book 40 includes two covers 50a and 50b and top rail 156 and bottom rail 158. Although top rail 156 and bottom rail 158 are not clearly shown in FIG. 8, those skilled in the art will appreciate that a better view of these rails is presented in FIG. 6. Logic book 40 also includes an outside mounted, wrap-around tailstock bracket 41 held in place with two screws 42. The logic book surrounds one or more logic cards. Tabs 43 on covers 50a and 50b provide a tight sliding fit with holes 44 on wrap-around tailstock bracket 41. Springs 45a and 45b are attached directly to wrap-around tailstock bracket 41, which provide critical tailstock-to-cage grounding and EMI sealing at the top and bottom of the book.

The design depicted in FIG. 8 improves tailstock grounding because book-to-book ground springs directly contact wrap-around tailstock bracket 41. Connection to the tailstock on the design illustrated in FIG. 3 is made through the book side covers such as covers 32a and 32b, and then to the tailstock, which results in a much higher impedance connection than the design depicted in FIG. 8. This is particularly true when utilizing conductive plastic book covers, which is common with logic book designs such as the one depicted in FIG. 3. The wrap-around tailstock bracket 41 depicted in FIG. 8 also leaves no open apertures to the outside system. Any open apertures between wrap-around tailstock bracket 41 and side covers 50a and 50b are open inside an electromagnetic compatibility (EMC) boundary inherent in such circuit structures or inside the book-to-book grounding, as opposed to the design illustrated in FIG. 3.

Figure 9:
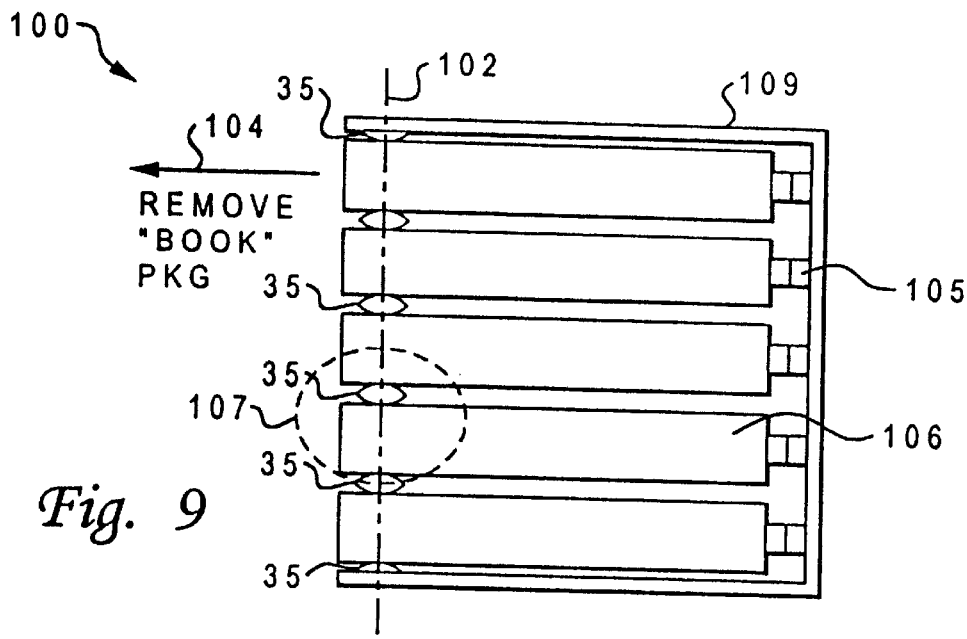
FIG. 9 depicts a top view of a cage assembly having multiple logic cards disposed therein, in accordance with a preferred embodiment of the present invention.

Wrap-around tailstock bracket 41 also provides a low impedance metal contact to the cage assembly (FIG. 9 presents an example of a cage assembly) at the top 56 and bottom 58 of logic book 40. On previous designs such as the one depicted in FIG. 3, the top and bottom contacts were fastened respectively to top and bottom electrically conductive plastic rails, and contacted the side covers and then the tailstock, resulting in a higher impedance path running from the contacts to the plastic rails and then to the side covers the tailstock. Such conductive plastic is not as conductive as sheet metal. Logic book 40 avoids this problem. Because wrap-around tailstock bracket 41 of FIG. 8 has right angle bends in a "wrap-around" formation, springs 45a and 45b and the contacting book covers 50a and 50b provide an inherently straighter configuration than the structure illustrated in FIG. 3. This inherent straightness also reduces gaps in logic book 40. Similarly, the "Z" bends (i.e. Z-section bends) in covers 50a and 50b act to stiffen and straighten logic book 40. Logic book 40 can be utilized in accordance with computer system 20 and subsequent hardware implementation depicted respectively in FIG. 1 and FIG. 2 herein.

FIG. 9 depicts a top view of a cage assembly 100 having multiple logic cards disposed therein, in accordance with a preferred embodiment of the present invention. Arrow 104 indicates the direction in which logic books may be removed from cage assembly 100. Cage assembly 100 includes an outer wall 109 which surrounds logic books contained within cage assembly 100. A typical logic book 106 is depicted within cage assembly 100 along with four other associated logic books. Those skilled in the art will appreciate, of course, that the number of logic books which may be available is not a necessary feature of cage assembly 100. Five logic books are depicted in FIG. 9 for illustrative purposes only. Fewer or more logic books may be utilized in accordance with a preferred embodiment of the present invention. In FIG. 9, An EMC boundary 102 is depicted by dashed lines, along with a typical connector 105. Each logic book is connected to cage assembly 100 via such connectors. In addition conductive flexible springs 35, which are identical to the conductive flexible springs 35 depicted in FIG. 3, are positioned between each logic book 106. Each logic book 106 is analogous to logic book 40 described herein (e.g., see FIG. 8 and related text). An area 107 is outlined in FIG. 9 which is further described in FIG. 10 and FIG. 11. Please note that in FIG. 10 and FIG. 11, like parts are referenced by identical reference numerals.

Figure 10:
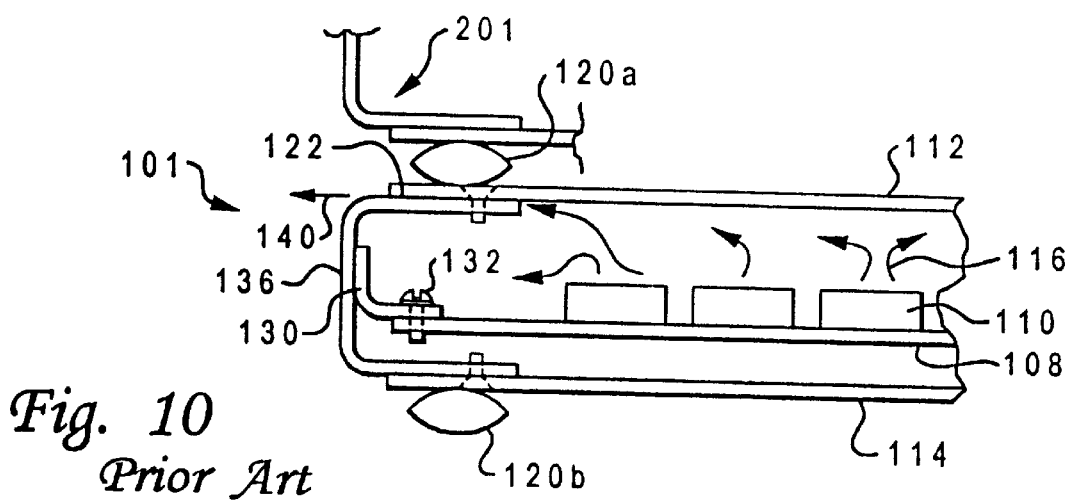
FIG. 10 illustrates a top sectional view of a prior art logic book.

FIG. 10 illustrates a top sectional view of a prior art logic book 101. A tailstock bracket 136 sits between a left book cover 112 and a right book cover 114. A PC or similar logic card 108 is connected to tailstock bracket 136 via a connector 130 and a screw 132 which fits through a hole in connector 130 and a hole in logic card 108. Arrows 116 indicate electromagnetic radiation derived from components 110 of logic card 108. Book to book grounding springs 120a and 120b are respectively provided on the sides of logic book 101. A seam 122 is formed between left book cover 112 and tailstock bracket 136 through which electromagnetic radiation may leak, as indicated by arrow 140. A portion of an adjacent logic book 201 is also indicated in FIG. 10. Logic book 201 sits adjacent logic book 101, separated by spring 120a.

Figure 11:
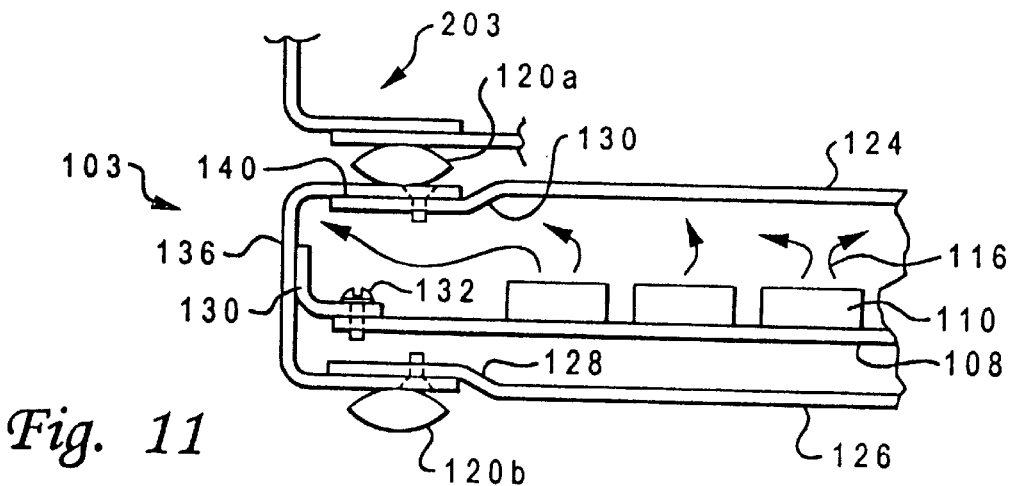
FIG. 11 depicts a top sectional view of a logic book, including an attached tailstock bracket, in accordance with a preferred embodiment of the present invention.

FIG. 11 depicts a top sectional view of a logic book 103, including an attached tailstock bracket 136, in accordance with a preferred embodiment of the present invention.

Logic book 103 includes a left book cover 124 and a right book cover 126. Positioned between these book covers is a logic card 108 which includes components 110 from which radiation 116 can emanate. Left book cover 124 includes a Z-sectional bend 130. Right book cover 126 includes a Z-sectional bend 128. As opposed to the configuration depicted in FIG. 10, in the configuration of FIG. 11, tailstock bracket 136 wraps about a portion of these Z-sectional bends. In the configuration depicted in FIG. 10, the tailstock bracket lies within the left and right book covers.

Thus, it can be seen from these figures that tailstock bracket 136 includes right angle bends which contact the Z-sectional bends to stiffen and straighten the left and right book covers. This formation is inherently straighter and stiffer than the configuration depicted in FIG. 10. A seam 140 is depicted in the configuration of FIG. 11 formed between Z-sectional bend 130 and tailstock bracket 136. Unlike the seam depicted in FIG. 10, seam 140 prevents electromagnetic radiation 116 from escaping from the enclosure formed by left book cover 124 and right book cover 126. Tailstock bracket 136 leaves no open apertures to the outside of the system (i.e., the external environment). Any open apertures between the tailstock bracket and side covers (i.e., left book cover 124 and right book cover 126) are now open inside the EMC boundary (i.e., EMC boundary 102 of FIG. 9) or inside the book to book grounding area. A portion of an adjacent logic book 203 is also indicated in FIG. 11. Logic book 203 sits adjacent logic book 103, separated by spring 120a.

The embodiments and examples set forth herein are presented in order to best explain the present invention and its practical application and, thereby, to enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the following claims. For example, any system in which logic card mounting is required can be utilized in accordance with a preferred embodiment of the present invention. Likewise, any system requiring the utilization of logic card mounting and high frequency fast clock speeds can also be utilized in accordance with a preferred embodiment of the present invention. Those skilled in the art can thus appreciate that embodiments and examples set forth herein describe illustrative examples only.

What is claimed is:

1. An apparatus for preventing leakage of electromagnetic radiation from a modular electronic planar substrate surrounded by an enclosure that includes a bottom portion, a top portion, a first side portion having apertures adapted for receiving electronic cables, and a second side portion having electrical connections therein, wherein said apparatus comprises:

a bracket having a first end and a second end, said bracket connected to said first side portion, wherein said bracket includes an interior portion and an outer portion which contiguously form a first bracket wall, a second bracket wall and a third bracket wall, such that said second bracket wall is positioned approximately perpendicular to said first bracket wall and said third bracket wall;

a first cover and a second cover each having Z-sectional bends which contact said interior portion of said bracket at said first bracket wall and said third bracket wall to respectively form sealed seams which prevent electromagnetic radiation associated with said electronic planar substrate from leaking beyond said enclosure; and a first grounding spring and a second grounding spring respectively mounted at said first end and said second end of said bracket to provide a ground path from said enclosure to adjacent enclosures and assist in preventing said electromagnetic radiation associated with said electronic planar substrate from leaking beyond said enclosure.

2. The apparatus of claim 1 wherein said interior portion of said bracket wraps about said first side portion and flattens said first cover and said second cover respectively against said first bracket wall and said third bracket wall to provide rigid structural support to said enclosure.

3. The apparatus of claim 2 wherein said bracket is comprised of a highly conductive material.

4. The apparatus of claim 3 wherein said bracket comprises a tailstock bracket.

5. The apparatus of claim 4 wherein said modular electronic planar substrate includes electronic components capable of emitting electromagnetic radiation.

6. The apparatus of claim 5 wherein said modular electronic planar substrate comprises a logic card.

7. The apparatus of claim 6 wherein said tailstock bracket includes at least one release mechanism for removing said tailstock bracket from said first side portion of said enclosure.

8. The apparatus of claim 7 wherein said tailstock bracket comprises a wrap-around tailstock bracket.

9. The apparatus of claim 8 wherein said wrap around tailstock bracket provides a low impedance metal contact to said enclosure at said top portion and said bottom portion of said enclosure.

* * * * *